US009838004B2

(12) United States Patent
Snowdon et al.

(10) Patent No.: US 9,838,004 B2
(45) Date of Patent: Dec. 5, 2017

(54) ENHANCED PROTECTIVE MULTIPLEXER

(71) Applicant: Fairchild Semiconductor Corporation, San Jose, CA (US)

(72) Inventors: Kenneth P. Snowdon, Falmouth, ME (US); Julie Lynn Stultz, Scarborough, ME (US)

(73) Assignee: Fairchild Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 15/079,304

(22) Filed: Mar. 24, 2016

(65) Prior Publication Data
US 2016/0285446 A1 Sep. 29, 2016

Related U.S. Application Data

(60) Provisional application No. 62/137,476, filed on Mar. 24, 2015.

(51) Int. Cl.
*H03K 17/00* (2006.01)
*H03K 17/693* (2006.01)
*H03K 17/0812* (2006.01)

(52) U.S. Cl.
CPC ..... *H03K 17/693* (2013.01); *H03K 17/08122* (2013.01); *H03K 2217/0018* (2013.01); *H03K 2217/0054* (2013.01)

(58) Field of Classification Search
CPC ..... G11C 16/0483; G11C 16/08; G11C 16/10; G11C 16/26; G11C 16/30
See application file for complete search history.

(56) References Cited

U.S. PATENT DOCUMENTS

| 4,093,874 A | 6/1978 | Pollitt |
| 5,514,994 A | 5/1996 | Sawada |
| 5,801,577 A | 9/1998 | Tailliet |

(Continued)

FOREIGN PATENT DOCUMENTS

| CN | 1866742 A | 11/2006 |
| CN | 1320298 A | 10/2011 |

(Continued)

OTHER PUBLICATIONS

"U.S. Appl. No. 13/107,491, Final Office Action dated Feb. 7, 2013", 14 pgs.

(Continued)

*Primary Examiner* — Sibin Chen
(74) *Attorney, Agent, or Firm* — Brake Hughes Bellermann LLP

(57) ABSTRACT

Systems and methods are disclosed, including a protection multiplexer circuit configured to receive a control signal and a reference voltage, to provide the reference voltage at an output when the control signal is in a first state, and to isolate the reference voltage from the output when the control signal is in a second state. The protection multiplexer circuit includes cascaded first and second transistors, wherein the first transistor is a native transistor. Control inputs of the first and second transistors are configured to receive the control signal, a first terminal of the first transistor is configured to receive the reference voltage, and the first terminal of the second transistor is coupled to the output. Methods of operation are disclosed, and other embodiments.

19 Claims, 2 Drawing Sheets

(56) References Cited

U.S. PATENT DOCUMENTS

| | | |
|---|---|---|
| 5,914,589 A | 6/1999 | Erckert |
| 6,121,694 A | 9/2000 | Thereze |
| 6,160,437 A | 12/2000 | Kim et al. |
| 6,163,199 A | 12/2000 | Miske et al. |
| 6,225,853 B1 | 5/2001 | Matsushita |
| 7,002,405 B2 | 2/2006 | Brooks et al. |
| 7,427,887 B2 | 9/2008 | O'donnell et al. |
| 7,436,241 B2 | 10/2008 | Chen et al. |
| 7,782,117 B2 | 8/2010 | Stultz et al. |
| 8,009,395 B2 | 8/2011 | Graves et al. |
| 8,536,928 B1 | 9/2013 | Gagne et al. |
| 8,547,159 B2 | 10/2013 | Morra |
| 8,564,918 B2 | 10/2013 | Gagne et al. |
| 8,610,489 B2 | 12/2013 | Daigle et al. |
| 8,710,900 B2 | 4/2014 | Gagne et al. |
| 8,779,839 B2 | 7/2014 | Snowdon |
| 8,975,923 B2 | 3/2015 | Gagne et al. |
| 2003/0016072 A1 | 1/2003 | Ramakrishnan |
| 2004/0196089 A1 | 10/2004 | O'donnell et al. |
| 2006/0202742 A1 | 9/2006 | Aksin et al. |
| 2010/0225379 A1 | 9/2010 | Ramet |
| 2011/0199146 A1 | 8/2011 | Bakalski et al. |
| 2011/0260780 A1 | 10/2011 | Granger-jones et al. |
| 2011/0293100 A1 | 12/2011 | Stultz et al. |
| 2012/0274362 A1 | 11/2012 | Doris et al. |
| 2012/0286845 A1 | 11/2012 | Morra |
| 2013/0009797 A1 | 1/2013 | Grilo et al. |
| 2013/0049847 A1 | 2/2013 | Glibbery |
| 2013/0106391 A1* | 5/2013 | Tran .................. G05F 3/30 323/313 |
| 2013/0106504 A1* | 5/2013 | Lin .................. H01L 25/03 327/566 |
| 2013/0154720 A1 | 6/2013 | Snowdon |
| 2013/0249621 A1 | 9/2013 | Gagne et al. |
| 2013/0307591 A1 | 11/2013 | Daigle et al. |
| 2014/0049861 A1 | 2/2014 | Gagne et al. |

FOREIGN PATENT DOCUMENTS

| | | |
|---|---|---|
| CN | 102790608 A | 11/2012 |
| CN | 202652168 U | 1/2013 |
| CN | 203057097 U | 7/2013 |
| CN | 103427630 A | 12/2013 |
| CN | 103427815 A | 12/2013 |
| CN | 103633988 A | 3/2014 |
| CN | 203482179 U | 3/2014 |
| KR | 1020140024227 A | 2/2014 |

OTHER PUBLICATIONS

"U.S. Appl. No. 13/107,491, Non Final Office Action dated Sep. 7, 2012", 12 pgs.

"U.S. Appl. No. 13/107,491, Notice of Allowance dated May 28, 2013", 6 pgs.

"U.S. Appl. No. 13/107,491, Preliminary Amendment dated May 13, 2011", 6 pgs.

"U.S. Appl. No. 13/107,491, Response filed Jan. 7, 2013 to Non Final Office Action dated Sep. 7, 2012", 10 pgs.

"U.S. Appl. No. 13/107,491, Response filed May 6, 2013 to Final Office Action dated Feb. 7, 2013", 7 pgs.

"U.S. Appl. No. 13/331,332, Non Final Office Action dated Nov. 8, 2013", 8 pgs.

"U.S. Appl. No. 13/331,332, Notice of Allowance dated Mar. 14, 2014", 5 pgs.

"U.S. Appl. No. 13/331,332, Response filed Feb. 10, 2014 to Non Final Office Action dated Nov. 18, 2013", 8 pgs.

"U.S. Appl. No. 13/471,832, Notice of Allowance dated Jul. 9, 2013", 9 pgs.

"U.S. Appl. No. 13/471,832, Notice of Allowance dated Aug. 14, 2013", 8 pgs.

"U.S. Appl. No. 13/481,267 , Response filed Apr. 15, 2013 to Final Office Action dated Apr. 4, 2013", 10 pgs.

"U.S. Appl. No. 13/481,267, Final Office Action dated Apr. 4, 2013", 11 pgs.

"U.S. Appl. No. 13/481,267, Non Final Office Action dated Mar. 12, 2013", 11 pgs.

"U.S. Appl. No. 13/481,267, Notice of Allowance dated May 16, 2013", 9 pgs.

"U.S. Appl. No. 13/481,267, Response filed Mar. 20, 2013 to Non Final Office Action dated Mar. 12, 2013", 10 pgs.

"U.S. Appl. No. 13/589,690, Non Final Office Action dated Jun. 27, 2014", 6 pgs.

"U.S. Appl. No. 13/589,690, Notice of Allowance dated Oct. 29, 2014", 8 pgs.

"U.S. Appl. No. 13/589,690, Preliminary Amendment filed Nov. 13, 2012", 3 pgs.

"U.S. Appl. No. 13/589,690, Response filed Sep. 29, 2014 to Non Final Office Action dated Jun. 27, 2014", 7 pgs.

"Chinese Application Serial No. 201210147424.1, Office Action dated Apr. 2, 2014", w/English Translation, 11 pgs.

"Chinese Application Serial No. 201210558652.8, Office Action dated Feb. 3, 2015", 11 pgs.

"Chinese Application Serial No. 201220710553.2, Notification to Make Rectification dated Apr. 10, 2013", 2 pgs.

"Chinese Application Serial No. 201220710553.2, Response filed Apr. 15, 2013 to Notification to Make Rectification dated Apr. 10, 2013", 5 pgs.

"Chinese Application Serial No. 201320265913.7, Notification to Make Rectification dated Aug. 15, 2013", 2 pgs.

"Chinese Application Serial No. 201320292597.2, Office Action dated Sep. 2, 2013", w/English Claims, 36 pgs.

"Chinese Application Serial No. 201320292597.2, Response filed Oct. 9, 2013 to Office Action dated Sep. 2, 2013", w/English Claims, 25 pgs.

\* cited by examiner

ENHANCED PROTECTIVE MULTIPLEXER

CLAIM OF PRIORITY

This application claims the benefit of priority under 35 U.S.C. §119(e) of Kenneth P. Snowdon et al. U.S. Provisional Patent Application Ser. No. 62/137,476, titled "ENHANCED PROTECTIVE MULTIPLEXER," filed on Mar. 24, 2015, which is incorporated by reference herein in its entirety.

BACKGROUND

Electronic devices, for various reasons, including size or cost, have a limited number of input/output ports or connectors. Accordingly, various accessory devices, such as power sources, data storage devices, or one or more other accessory devices, can be coupled to the electronic device using a common connector, for example, to share the limited number of input/output ports. The various accessory devices can operate using a variety of voltage levels, both high and low.

To accommodate the various accessory devices at the common connector, the electronic device can include one or more multiplexer (MUX) circuits configured to couple one or more different signals to the common connector depending on the accessory device coupled to the common connector.

OVERVIEW

This document discusses, among other things, a system including a protection multiplexer circuit configured to receive a control signal and a reference voltage using a native transistor, to provide the reference voltage at an output when the control signal is in a first state, and to isolate the reference voltage from the output when the control signal is in a second state. The protection multiplexer circuit includes cascaded first and second transistors, wherein the first transistor is a native transistor. Control inputs of the first and second transistors are configured to receive the control signal, a first terminal of the first transistor is configured to receive the reference voltage, and the first terminal of the second transistor is coupled to the output. Methods of operation are disclosed, and other embodiments.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Pass gates are electronic components used to either pass a signal between first and second terminals in a first, low-impedance state (e.g., an "on" state), or to isolate (e.g., electrically isolate) the first and second terminals in a second, high-impedance state (e.g., an "off" state). A pass gate can include one or more metal-oxide-semiconductor field-effect transistors (MOSFETs) configured to pass an input signal between a source and a drain of a transistor, or to isolate the source from the drain, based on, for example, one or more control signals provided to a gate of the transistor.

Pass gates can pass various types of signals between an input and an output (e.g., the first and second terminals, respectively). The control signals for the one or more transistors in the pass gate can depend on the characteristics of the signal being transferred and the type of transistors in the pass gate. In certain examples, to keep the pass gate in a desired state, the control signals must be either more positive or more negative than the signals at the first or second terminals. In other examples, to provide an accurate representation of an input signal at an output, the control signals can follow the input signal, such as to provide a constant gate-to-source voltage of the one or more transistors, reducing impedance variation between the first and second terminals while the one or more transistors are in a desired state.

Protective multiplexer circuits have been developed to, among other things, accommodate multiple different accessory devices at a common connector of an electronic device, and to protect the electronic device from harm from different voltage levels of the various accessory devices. For example, a multiplexer circuit can include a combination universal serial bus (USB)/audio switch, including one or more pass gates or switches configured to pass or direct USB or audio signals to or from the electronic device. In other examples, the multiplexer circuit can be configured to selectively pass one or more other signals.

Figure 1:
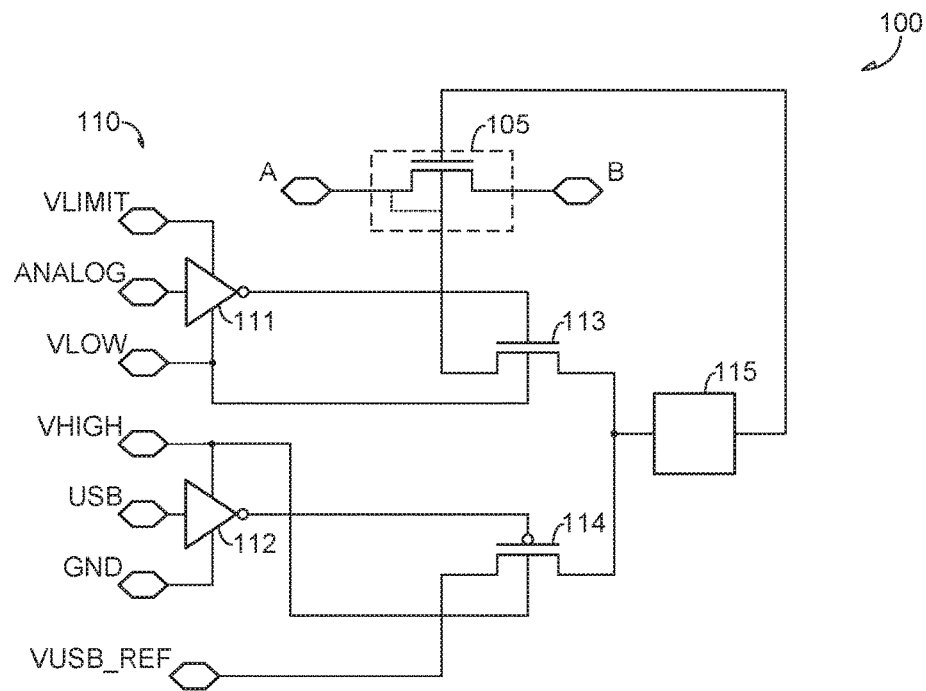
FIG. 1 illustrates generally an example multiplexer system.

FIG. 1 illustrates generally an example multiplexer system 100 including a pass gate 105 configured to pass a signal between a first terminal (A) and a second terminal (B), a multiplexer circuit 110 including first and second logic gates 111, 112, first and second select transistors 113, 114, and a charge pump 115. In other examples, the multiplexer system 100 can include more or less charge pumps, logic gates, or select transistors, depending on, for example, one or more desired characteristics or select signals.

The multiplexer system 100 can receive one or more select signals, such as an analog select signal (ANALOG) and a USB select signal (USB), etc. The first logic gate 111 (e.g., an inverter) can receive an analog select signal (ANALOG) and provide an output to a gate of the first select transistor 113. The output of the first logic gate 111 can range between a limit voltage (VLIMIT) and a low supply rail (VLOW), and the low supply rail (VLOW) can be provided to a bulk of the first select transistor 113. The second logic gate 112 (e.g., an inverter) can receive a USB select signal (USB) and provide an output to a gate of the second select transistor 114. The output of the second logic gate 112 can range between a high rail supply voltage (VHIGH) and ground (GND), and the high rail supply voltage (VHIGH) can be provided to a bulk of the second select transistor 114.

In an example, one or more of the first and second terminals (A, B) can be coupled to the bulk of the pass gate 105, such as using one or more transistors and control logic, etc. e.g., illustrated in FIG. 1 using a dashed line). When the first select transistor 113 is in an "on" state, the voltage from one or more of the first and second terminals (A, B) (e.g., a common mode of the first and second terminals, in certain examples, the higher of the first and second terminals, etc.) can be provided to the charge pump 115, and the output of the charge pump 115 can be provided to a gate of the pass gate 105, having a negative with a constant VGS with reference to the voltage of the input signal.

In contrast, when the second select transistor 114 is in an "on" state, a USB reference voltage (VUSB_REF) can be provided to the charge pump 115, such as through the second select transistor 114. The VUSB_REF can include a single, constant voltage or, in other examples, can follow one of the first or second terminal voltages. Similarly, VLIMIT, VLOW, and VHIGH can include or be based on one or more voltages in the system 100, such as the higher or lower of one of the voltages on the first or second terminals (A, B), a supply voltage (VCC or VDD), the output of the charge pump 115, or one or more other voltages.

In certain examples, the pass gate 105 can include a constant VGS switch, such as disclosed in the commonly assigned Snowdon U.S. Pat. No. 8,779,839, filed Dec. 20, 2011, titled "Constant VGS Switch," or the system 100 can include a protective multiplexer, such as described in the commonly assigned Gagne et al. U.S. Pat. No. 8,975,923, filed Aug. 20, 2012, titled "Protective Multiplexer," each of which are hereby incorporated herein by reference in their entirety.

Although illustrated as an n-type pass gate, inverters, an n-type transistor, and a p-type transistor in the example of FIG. 1, respectively, in other examples, the pass gate 205, the first and second logic gates 111, 112, and the first and second select transistors 113, 114 can include one or more other logic gates or transistor type or configuration depending on, for example, one or more desired characteristics or select signals.

Figure 2:
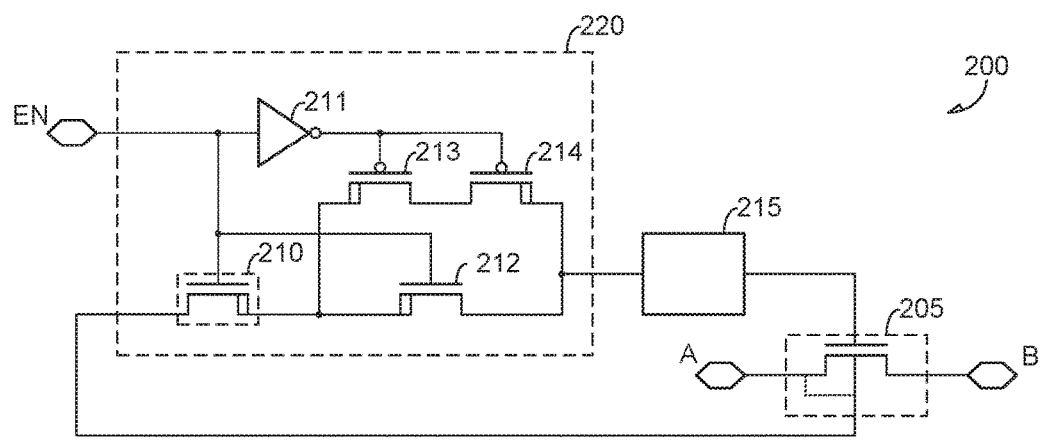
FIG. 2 illustrates generally an example enhanced protective multiplexer system.

FIG. 2 illustrates generally an example enhanced protective multiplexer system 200 including a pass gate 205 configured to pass a signal between a first terminal (A) and a second terminal (B), a first enhanced protective multiplexer circuit 220, and a charge pump 215. The first enhanced protective multiplexer circuit 220 can receive an enable signal (EN) and, when enabled, provide a reference voltage (e.g., such as a terminal voltage of the pass gate, a threshold voltage, or one or more other common mode or system voltages (e.g., ground (GND), a source voltage (VCC or VDD), etc.), etc.) to an input (e.g., a reference input) of the charge pump 215. In an example, the system 200 can include a plurality of enhanced protective or other multiplexer circuits, each receiving a separate enable signal or providing a reference to the input of the charge pump 215.

The enhanced protective multiplexer circuit 220 illustrated in FIG. 2 includes a native transistor 210, a first logic gate 211, first, second, and third select transistors 212, 213, 214, and a charge pump 215. In other examples, the enhanced multiplexer system 200 or circuit 220 can include more or less charge pumps, logic gates, or select transistors, depending on, for example, one or more desired characteristics or select signals.

The enhanced protective multiplexer system 200 can extend protective multiplexer concepts to a more generic application of multiplexing two or more references for a charge pump 215 (e.g., a switching voltage amplifier, a constant VGS charge pump, etc.). The reference voltage range for the charge pump 215 can be extended, and the switch off a reference voltage can be enhanced so that the input of the charge pump 215 can be any voltage relative to the reference voltage. In certain examples, a multiplexer reference can connect any common mode to the charge pump 215 (e.g., the switching voltage amplifier), such as high speed serial transmission standards, USB, mobile high-definition link (MHL), audio signals, etc.

Native transistors, generally, are a specific variety of metal-oxide-semiconductor field-effect transistor (MOSFET) with very little threshold voltage, due, for example, to the thin oxide film formed over the semiconductor material formed during processing of other layers. Native transistors are typically formed directly on a surface of a doped semiconductor region that has not undergone any surface depletion or enhancement (e.g., without ion implantation or diffusion after formation of a well), and rely on the body of the transistor to set the threshold voltage (theoretically 0V, but typically 0.1V to 0.3V, etc.). The low threshold voltage can be beneficial in low-voltage applications, however, native transistors typically require a larger die area (e.g., a minimum gate size 2-3 times longer and wider than a standard threshold voltage transistor, etc.) and have a lower transconductance. The native transistor 210 can be used to provide a constant VGS charge pump, reducing the would be otherwise required component count and lowering the supply range over alternative means of producing a voltage limit to the input of the charge pump 215. In an example, the native transistor 210 can include an n-type device. In other examples, one or more other types or configurations of devices can be used according to the principles disclosed herein.

In an example, one or more of the first, second, and third select transistors 212, 213, 214 can include complimentary metal-oxide-semiconductor (CMOS) transistors. The first select transistor 212 can include an n-type transistor, and the second and third select transistors 213, 214 can be drain-coupled, back-to-back, p-type transistors. In other examples, one or more other transistor types or configurations can be used.

The enhanced protective multiplexer 200 can provide an increased range of switch common mode voltage over existing multiplexer circuits due to, for example, the first select transistor 212 cascaded with the native transistor 210. Further, the second and third select transistors 213, 214 can block one or more other voltages coupled to the charge pump 215 (e.g., and prevent leakage back into the native transistor 210 in an "off" state), such as when multiple multiplexer circuits are coupled to the input of the charge pump 215. The first, second, and third select transistors 212, 213, 214 can allow for a full range of signal voltage to be passed to the charge pump 215 in respective "on" states, while providing full isolation from the charge pump 215, or one or more other circuits coupled to the charge pump 215, in respective "off" states.

In the examples illustrated in FIGS. 1-2, components, such as the gates of the native transistor 210 and the first transistor 212, shown with lines directly connecting them can either be coupled, or directly coupled, unless otherwise indicated. If two elements are coupled, one or more intervening elements may be present. In contrast, in embodiments where an element is referred to as "directly coupled" to another element, there can be no intervening elements in those embodiments.

Figure 3:
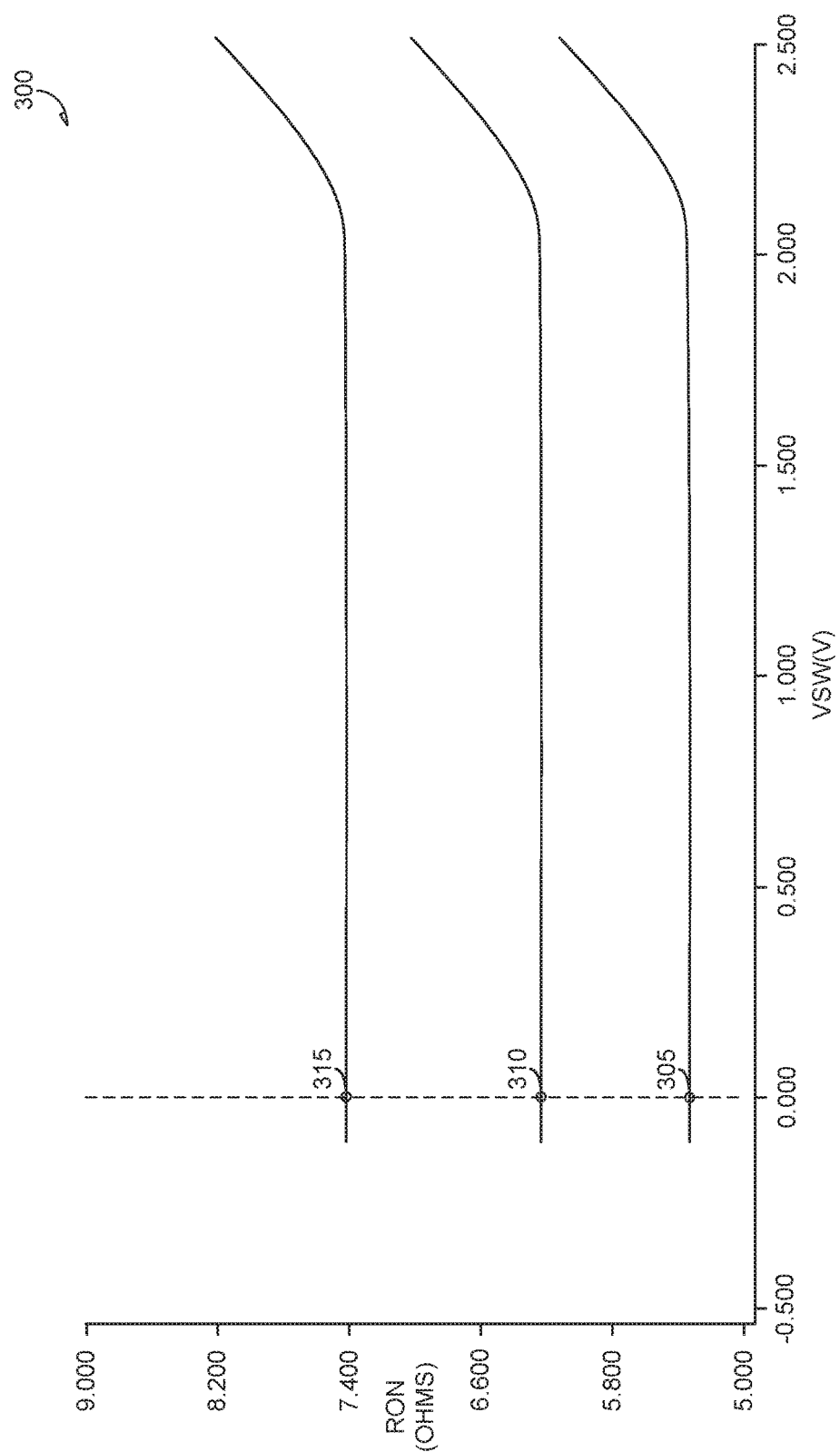
FIG. 3 illustrates generally example performance of an enhanced protective multiplexer circuit at different operating temperatures.

FIG. 3 illustrates generally example "on" resistance (RON) performance of an enhanced protective multiplexer circuit at first, second, and third operating temperatures 305, 310, 315.

Using a native transistor to clamp the voltage at the charge pump allows an existing voltage on the die to clamp the maximum gate voltage of the third select transistor. In an example, the output of the native transistor clamp can be the lower of a gate or supply voltage. For example, if the voltage at a terminal is less than the supply voltage, the output of the native transistor can be the terminal voltage, whereas if the voltage at the terminal is greater than the supply voltage, the output of the native transistor can be the supply voltage.

Further, the "on" resistance of the native transistor can be proportional to the gate voltage. FIG. 3 illustrates generally the "on" resistance (RON) of the native transistor across a sweep of gate voltages at different temperatures, with one terminal of the native transistor clamped at 2V.

ADDITIONAL NOTES AND EXAMPLES

In Example 1, a protection multiplexer system includes a multiplexer circuit configured to receive a control signal and a reference voltage using a native transistor, to provide the reference voltage at an output when the control signal is in a first state, and to isolate the reference voltage from the output when the control signal is in a second state, wherein the multiplexer circuit includes cascaded first and second transistors, wherein the first transistor is a native transistor, and wherein control inputs of the first and second transistors are configured to receive the control signal, a first terminal of the first transistor is configured to receive the reference voltage, and a first terminal of the second transistor is coupled to the output.

In Example 2, a second terminal of the first transistor of Example 1 is optionally coupled to a second terminal of the second transistor.

In Example 3, the first transistor of any one or more of Examples 1-2 is optionally an n-type native transistor, and the second transistor is optionally an n-type, complimentary metal-oxide-semiconductor (CMOS) field-effect transistor.

In Example 4, the first terminal of the first and second transistors of any one or more of Examples 1-3 optionally includes a drain, the second terminal of the first and second transistors optionally includes a source, and the control input of the first and second transistors includes a gate.

In Example 5, any one or more of Examples 1-4 optionally includes cascaded third and fourth transistors between the first, native transistor and the output, each of the third and fourth transistors having a control input and first and second terminals, and a logic gate configured to receive the control signal and to provide an inverted control signal to the control inputs of the third and fourth transistors.

In Example 6, the third and fourth transistors of any one or more of Examples 1-2 is optionally are p-type transistors, the first terminal of the third transistor is optionally coupled to the first terminal of the fourth transistor, the second terminal of the third transistor is optionally coupled to the second terminals of the first and second transistors, and the second terminal of the fourth transistor is optionally coupled to the first terminal of the second transistor.

In Example 7, the first terminals of the third and fourth transistors of any one or more of Examples 1-6 are optionally drains, the second terminals are optionally sources, the control inputs are optionally gates, and the logic gate optionally includes an inverter.

In Example 8, any one or more of Examples 1-7 optionally includes a charge pump configured to receive the reference voltage from the multiplexer circuit.

In Example 9, any one or more of Examples 1-8 optionally includes a pass gate configured to pass a signal from a first terminal to a second terminal in a first, low-impedance state, and to isolate the first terminal from the second terminal in a second, high-impedance state, wherein the pass gate is controlled using an output voltage of the charge pump.

In Example 10, a method includes receiving a control signal at first and second control inputs of cascaded first and second transistors, wherein the first transistor is a native transistor, receiving a reference voltage at a first terminal of the first transistor, and providing the reference voltage at the first terminal of the second transistor when the control signal is in a first state, and isolating the reference voltage from the first terminal of the second transistor when the control signal is in a second state.

In Example 11, the first transistor of any one or more of Examples 1-10 is optionally an n-type native transistor, the second transistor is optionally an n-type, complimentary metal-oxide-semiconductor, (CMOS) field-effect transistor, the first terminals of the first and second transistors are optionally drains, the second terminals are optionally sources, the control inputs are optionally gates, and the source of the first transistor is optionally coupled to the source of the second transistor.

In Example 12, any one or more of Examples 1-11 optionally includes receiving the control signal at a logic gate and providing an inverted control signal to control inputs of third and fourth cascaded transistors coupled between the first and second terminals of the second transistor.

In Example 13, the third and fourth transistors of any one or more of Examples 1-12 are optionally p-type transistors, the first terminal of the third transistor is optionally coupled to the first terminal of the fourth transistor, the second terminal of the third transistor is optionally coupled to the second terminals of the first and second transistors, the second terminal of the fourth transistor is optionally coupled to the first terminal of the second transistor, and the first terminals of the third and fourth transistors are optionally drains, the second terminals are optionally sources, and the control inputs are optionally gates, and the logic gate optionally includes an inverter.

In Example 14, any one or more of Examples 1-13 optionally includes receiving the reference voltage from the first terminal of the second transistor at an input of a charge pump, and controlling a pass gate using the output of the charge pump.

In Example 15, a system or apparatus can include, or can optionally be combined with any portion or combination of any portions of any one or more of Examples 1-14 to include, means for performing any one or more of the functions of Examples 1-14, or a machine-readable medium including instructions that, when performed by a machine, cause the machine to perform any one or more of the functions of Examples 1-14.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. If two elements are shown in the drawings with a line connecting them, the two elements can be either be coupled, or directly coupled, unless otherwise indicated. If two elements are coupled, one or more intervening elements may be present. In contrast, in embodiments where an element is referred to as "directly coupled" to another element, there can be no intervening elements in those embodiments.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A hut not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A protection multiplexer system, comprising:
 a multiplexer circuit configured to receive a control signal and a reference voltage using a native transistor, to provide the reference voltage at an output when the control signal is in a first state, and to isolate the reference voltage from the output when the control signal is in a second state, wherein the multiplexer circuit includes:
  cascaded first and second transistors, wherein the first transistor is the native transistor and the second transistor is a second type of transistor different than the first, native transistor;
  a third transistor between the first transistor and the output; and
  a logic gate configured to receive the control signal and to provide an inverted control signal to a control input of the third transistor,
 wherein control inputs of the first and second transistors are configured to receive the control signal, a first terminal of the first transistor is configured to receive the reference voltage, and a first terminal of the second transistor is coupled to the output.

2. The system of claim 1,
 wherein a second terminal of the first transistor is coupled to a second terminal of the second transistor, and
 wherein the second transistor is a complimentary metal-oxide-semiconductor (CMOS) field-effect transistor.

3. The system of claim 1,
 wherein the first transistor is an n-type native transistor, and
 wherein the second transistor is an n-type, complimentary metal-oxide-semiconductor (CMOS) field-effect transistor.

4. The system of claim 3,
 wherein the first terminal of the first and second transistors includes a drain, a second terminal of the first and second transistors includes a source, and the control input of the first and second transistors includes a gate.

5. The system of claim 1, wherein the multiplexer circuit includes a fourth transistor cascaded with the third transistor between the first transistor and the output.

6. The system of claim 5,
 wherein the third and fourth transistors are p-type transistors,
 wherein a first terminal of the third transistor is coupled to a first terminal of the fourth transistor,
 wherein a second terminal of the third transistor is coupled to the second terminals of the first and second transistors, and
 wherein a second terminal of the fourth transistor is coupled to the first terminal of the second transistor.

7. The system of claim 5,
 wherein the first terminals of the third and fourth transistors are drains, the second terminals are sources, and the control inputs are gates, and
 wherein the logic gate includes an inverter.

8. The system of claim 1, including:
a charge pump configured to receive the reference voltage from the multiplexer circuit.

9. A protection multiplexer system, comprising:
a multiplexer circuit configured to receive a control signal and a reference voltage using a native transistor, to provide the reference voltage at an output when the control signal is in a first state, and to isolate the reference voltage from the output when the control signal is in a second state, wherein the multiplexer circuit includes cascaded first and second transistors, wherein the first transistor is the native transistor and the second transistor is a second type of transistor different than the first, native transistor;
a charge pump configured to receive the reference voltage from the multiplexer circuit; and
a pass gate configured to pass a signal from a first terminal to a second terminal in a first, low-impedance state, and to isolate the first terminal from the second terminal in a second, high-impedance state, wherein the pass gate is controlled using an output voltage of the charge pump,
wherein control inputs of the first and second transistors are configured to receive the control signal, a first terminal of the first transistor is configured to receive the reference voltage, and a first terminal of the second transistor is coupled to the output.

10. A protection multiplexer method, comprising:
receiving a control signal at first and second control inputs of cascaded first and second transistors, wherein the first transistor is a native transistor and the second transistor is a second type of transistor different than the first, native transistor;
receiving a reference voltage at a first terminal of the first transistor;
providing the reference voltage at the first terminal of the second transistor when the control signal is in a first state, and isolating the reference voltage from the first terminal of the second transistor when the control signal is in a second state;
receiving the control signal at a logic gate; and
providing an inverted control signal to a control input of a third transistor coupled between the first and second terminals of the second transistor.

11. The method of claim 10,
wherein the first transistor is an n-type native transistor, and the second transistor is an n-type, complimentary metal-oxide-semiconductor (CMOS) field-effect transistor,
wherein the first terminals of the first and second transistors are drains, the second terminals are sources, and the control inputs are gates, and
wherein the source of the first transistor is coupled to the source of the second transistor.

12. The method of claim 10,
wherein the third transistor is a p-type transistor,
wherein the second terminal of the third transistor is coupled to the second terminals of the first and second transistors,
wherein the first terminal of the third transistor is a drain, the second terminal is a source, and the control input is a gate, and
wherein the logic gate includes an inverter.

13. The method of claim 10, including:
receiving the reference voltage from the first terminal of the second transistor at an input of a charge pump; and
controlling a pass gate using an output of the charge pump.

14. A protection multiplexer system, comprising:
a multiplexer circuit configured to receive a control signal and a reference voltage, to provide the reference voltage at an output when the control signal is in a first state, and to isolate the reference voltage from the output when the control signal is in a second state, wherein the multiplexer circuit includes:
cascaded first and second transistors, wherein the first transistor is a native transistor; and
a third transistor between the first transistor and the output,
wherein control inputs of the first and second transistors are configured to receive the control signal, a control input of the third transistor is configured to receive an inverted control signal, a first terminal of the first transistor is configured to receive the reference voltage, and a first terminal of the second transistor is coupled to the output.

15. The system of claim 14, including:
a logic gate configured to receive the control signal and to provide the inverted control signal to the control input of the third transistor;
a charge pump configured to receive the reference voltage from the multiplexer circuit, and to provide a control voltage at an output; and
a pass gate configured to receive the control voltage from the charge pump, to pass a signal from a first terminal to a second terminal when the control voltage is in a first state, and to isolate the first terminal from the second terminal when the control voltage is in a second state.

16. The system of claim 14,
wherein the first transistor is an n-type native transistor, and
wherein the second transistor is an n-type, complimentary metal-oxide-semiconductor (CMOS) field-effect transistor.

17. The system of claim 16,
wherein a second terminal of the first transistor is coupled to a second terminal of the second transistor, and
wherein the first terminal of the first and second transistors includes a drain, the second terminal of the first and second transistors includes a source, and the control input of the first and second transistors includes a gate.

18. The system of claim 14, further comprising:
a fourth transistor cascaded with the third transistor,
wherein the third and fourth transistors are p-type transistors,
wherein a first terminal of the third transistor is coupled to a first terminal of the fourth transistor,
wherein a second terminal of the third transistor is coupled to the second terminals of the first and second transistors, and
wherein a second terminal of the fourth transistor is coupled to the first terminal of the second transistor.

19. The system of claim 18, further comprising:
a fourth transistor cascaded with the third transistor,
wherein the first terminals of the third and fourth transistors are drains, the second terminals are sources, and the control inputs are gates.

* * * * *